United States Patent
Nittka (10) Patent No.: US 9,945,924 B2
(45) Date of Patent: Apr. 17, 2018

(54) METHOD AND MAGNETIC RESONANCE SYSTEM FOR SLICE-SELECTIVE MAGNETIC RESONANCE IMAGING

(71) Applicant: Siemens Aktiengesellschaft, Munich (DE)

(72) Inventor: Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 788 days.

(21) Appl. No.: 14/573,391

(22) Filed: Dec. 17, 2014

(65) Prior Publication Data

US 2015/0168524 A1 Jun. 18, 2015

(30) Foreign Application Priority Data

Dec. 17, 2013 (DE) .......................... 10 2013 226 246

(51) Int. Cl.
*G01V 3/00* (2006.01)
*G01R 33/565* (2006.01)
*G01R 33/483* (2006.01)
*G01R 33/28* (2006.01)

(52) U.S. Cl.
CPC ... *G01R 33/56536* (2013.01); *G01R 33/4835* (2013.01); *G01R 33/288* (2013.01)

(58) Field of Classification Search
CPC .................................................. G01R 33/4833
USPC ...................................... 324/209, 307, 306
See application file for complete search history.

(56) References Cited

U.S. PATENT DOCUMENTS

| | | | | |
|---|---|---|---|---|
| 9,784,807 B2* | 10/2017 | Nittka | ................ | G01R 33/3678 |
| 2010/0033179 A1 | 2/2010 | Hargreaves et al. | | |
| 2013/0249548 A1* | 9/2013 | Stemmer | ............ | G01R 33/4835 |
| | | | | 324/309 |
| 2013/0278254 A1 | 10/2013 | Reeder et al. | | |
| 2014/0028314 A1* | 1/2014 | Paul | ..................... | G01R 33/387 |
| | | | | 324/309 |
| 2014/0266191 A1* | 9/2014 | Sveinsson | ........ | G01R 33/56563 |
| | | | | 324/309 |
| 2015/0301146 A1* | 10/2015 | Griswold | ......... | G01R 33/56536 |
| | | | | 324/309 |

OTHER PUBLICATIONS

Lu et al., "SEMAC: Slice Encoding for Metal Artifact Correction in MRI," Magnetic Resonance in Medicine, vol. 62 (2009), pp. 66-76.
Cho et al., "Total inhomogeneity correction including chemical shifts and susceptibility by view angle tilting," Med. Phys., vol. 15 (1), pp. 7-11 (1988).
Hargreaves et al., "Metal-Induced Artifacts in MRI," AJR, vol. 197 (2011), pp. 547-555.

* cited by examiner

*Primary Examiner* — Louis Arana
(74) *Attorney, Agent, or Firm* — Schiff Hardin LLP (57) ABSTRACT

In a SEMAC-like magnetic resonance imaging, MR data of multiple readout partitions of a target slice are used in order to reduce image artifacts due to magnetic field inhomogeneities. Slice-selectively excited nuclear spins are refocused via radiation of multiple refocusing pulses. For each refocusing pulse, at least one kz-phase coding gradient is respectively applied along a first direction (to define a readout partition) and at least one ky-phase coding gradient is applied along a second direction to acquire MR data, wherein the first and second directions are orthogonal to one another. The multiple refocusing pulses have at least two different flip angles.

11 Claims, 6 Drawing Sheets

METHOD AND MAGNETIC RESONANCE SYSTEM FOR SLICE-SELECTIVE MAGNETIC RESONANCE IMAGING

BACKGROUND OF THE INVENTION

Field of the Invention

The invention concerns techniques for slice-selective magnetic resonance imaging of a target slice of an examination subject, as well as a magnetic resonance system. In particular, the invention concerns techniques of the type that enable a reduced measurement time and/or radio-frequency radiation exposure, for example based on a Slice Encoding for Metal Artifact Correction (SEMAC) sequence.

Description of the Prior Art

In magnetic resonance (MR) imaging, nuclear spins in a subject are aligned or polarized by the application of a basic magnetic field, and that nuclear spins are subsequently by radiation of one or more radio-frequency (RF) pulses, deflected out of the steady state, or are specifically manipulated (thus refocused, for example). The locally polarizing magnetic field may exhibit inhomogeneities, i.e. fluctuations as a function of location. For example, this can be due to structurally dependent inhomogeneities of the basic magnetic field and/or due to the presence of susceptibility changes as a function of location. For example, such susceptibility changes can occur due to metal articles in the examination region, such as prostheses or surgical elements.

These inhomogeneities can produce image artifacts in MR images, for example, because the local resonance frequency of the nuclear spins is displaced due to the inhomogeneities and incorrect mappings thereby occur in the MR data. A defined point in space thus might be mapped to a different point in an MR image.

In order to suppress metal artifacts in spin echo (SE)-based measurement sequences, a Slice Encoding for Metal Artifact Correction (SEMAC) technique can be used; see "SEMAC: Slice Encoding for Metal Artifact Correction in MRI", W. Lu et al. Magn. Reson. in Med. 62 (2009) 66-76. In a SEMAC sequence an additional phase coding in the slice selection direction kz is typically implemented in connection with a conventional two-dimensional (2D) measurement sequence, or slice selective scanning of an examination subject.

Two effects can occur in connection with such SEMAC techniques. First, the entire time period (measurement time) required to acquire MR data typically increases linearly with the number of additional phase coding steps in the slice selection direction kz. This can limit the flexibility in the imaging and may produce movement artifacts or the like. Economy of operation of the MR system can simultaneously be limited. Second, an RF load produced by the MR imaging can increase, which is often quantified by a designation known as the specific absorption rate (SAR). This is typically the case because a large number of refocusing pulses with RF portion are radiated per time unit. Therefore, it may be necessary to provide additional downtimes in order to limit the SAR, thereby additionally lengthening the measurement time.

SUMMARY OF THE INVENTION

A need therefore exists for improved techniques to correct metal artifacts in MR data. In particular, a need exists for such techniques that enable a relatively short measurement time or a relatively low SAR.

These objects are achieved by the invention in a method for slice-selective MR imaging of a target slice of an examination subject. In the MR imaging, MR data from multiple readout partitions of the target slice are acquired and used, as well as from, multiple readout partitions of at least one additional slice. The data are used to reduce image artifacts due to magnetic field inhomogeneities. The at least one additional slice is adjacent to the target slice. The method includes the slice-selective excitation of nuclear spins by the application of at least one slice selection gradient along a first direction, with time-correlated radiation of at least one excitation pulse. The method also includes the slice-selective focusing of excited nuclear spins by the sequential application of multiple additional slice selection gradients along the first direction and via time-correlated radiation of multiple refocusing pulses. For each additional slice selection gradient with an associated refocusing pulse, the method includes: activation of at least one kz-phase coding gradient along the first direction, to define a readout partition, and activation of at least one ky-phase coding gradient along a second direction to acquire MR data, wherein the first direction and the second direction are orthogonal to one another. The multiple refocusing pulses have at least two different flip angles.

The acquired MR data are entered into the spatial frequency domain, i.e., into a memory organized as k-space. Therefore, such MR data are also often designated as raw data. For example, a defined readout partition can thus designate a defined region in k-space that is established by corresponding kz-phase coding gradients and/or ky-phase coding gradients. A readout partition thus can include a number of sample points of the MR data. For example, a readout partition can include all sample points of the measurement sequence that lie in a defined region of k-space along the slice selection direction kz (first direction). For example, sample points with different positions along the slice selection direction kz belong to different readout partitions.

It would be possible for those refocusing pulses that are associated with a readout partition to all have the same flip angles. In other words, such refocusing pulses that are associated with different readout partitions have different flip angles. Within a readout partition, the flip angles of the corresponding refocusing pulses can be constant. For example, a dependency of the flip angle of the refocusing pulses on the position coded by the associated kz-phase coding gradients along the first direction (i.e. the slice selection direction kz) can be achieved.

In general, only a single excitation pulse can be radiated to acquire the MR data of the target slice. However, it is also possible to radiate multiple excitation pulses within the scope of the acquisition of the MR data for the target slice, for example depending on a relaxation time of the nuclear spins. That can mean that excitation of the nuclear spins alternates with the readout, wherein the readout includes the radiation of the refocusing pulses and the application of the kz-phase coding gradients and the ky-phase coding gradients. For example, it is possible for a separate excitation pulse to be respectively radiated for each readout partition.

MR data also can be acquired for the at least one additional slice, for example with corresponding techniques as described in the preceding with regard to the target slice. For example, the method can furthermore include combining the MR data of the multiple readout partitions of the target slice and the MR data of the multiple readout partitions of the at least one additional slice to obtain combined MR data. The method can furthermore include applying a Fourier transformation to the combined MR data to obtain an MR image. The MR image then exists in the spatial domain. In general, the techniques described above and techniques that are described in the following can be combinable with methods known as partially parallel acquisition (PPA) methods that operate in the spatial domain and/or in k-space. One example would be the Generalized Autocalibrating Partial Parallel Acquisition (GRAPPA) technique.

The techniques described above also can be designated as slice-selective techniques, since typically solely the target slice is excited, and not an expanded three-dimensional (3D) volume. The techniques can be delimited compared to 3D measurement sequences in which no slice-selective excitation typically takes place or, respectively, in which a more extended volume is excited that is only resolved via 3D phase coding in significantly thinner individual slices. In contrast to this, in slice-selective excitation the excited slice thickness can be in the range of the order of magnitude of the resolution of the subsequently obtained MR images.

As a result of the excitation of the target slice, k-space is scanned (data is entered therein at) sample points that are grouped in k-space in multiple readout partitions. The multiple readout partitions are defined by the kz-phase coding along the first direction, i.e. the slice selection direction. A spatial coding using the phase of the nuclear spins can thus be conducted both along the first direction (slice selection direction) and along the second direction. This can allow the metal artifacts to be reduced. Such slice-selective excitation can lead to distortions in the excitation profile due to the local magnetic field inhomogeneities. The excitation typically no longer takes place in an ideally planar manner, but rather is distorted in the slice selection direction. In contrast to this, for a spatially accurate imaging of structures of the examination subject in the MR image it can be worthwhile for these distortions in the excitation not to be transferred to the target slice and the at least one additional slice. In other words, the target slice and the at least one additional slice can be predominantly planar. It is also possible that the slice-selective excitation of nuclear spins does not take place in a planar fashion due to the magnetic field inhomogeneities.

This distorted excitation profile can be compensated at least in part via scanning of k-space in the multiple readout partitions. The multiple readout partitions can include the region of the target slice and surrounding regions. Both those regions of the excitation profile that are situated within the target slice and those regions that are located outside of the target slice can thereby be scanned. Within the scope of the post-processing, a correction of the distorted excitation pulse can take place via a subsequent consideration of the MR data of multiple readout partitions, both of the target slice and of the at least one additional slice. The image artifacts can be reduced. In other words: the MR imaging can take into account MR data of the target slice and of the at least one additional slice within the scope of a SEMAC technique or a similar post-processing.

For example, the time-correlated radiation of the slice selection gradient along the first direction and the excitation pulse can mean essentially simultaneous application of the slice selection gradient along the first direction and radiation of the excitation pulse. Such techniques are fundamentally known to those skilled in the art in connection with slice selection within the scope of slice-selective excitation. Additional details for corresponding spatial coding do not need to be described herein.

For example, a single refocusing pulse or a series of refocusing pulses can follow after an excitation pulses. For example, an individual kz-phase coding gradient and a single ky-phase coding gradient can be respectively activated for each refocusing pulse to generate an SE. After a refocusing pulse, two kz-phase coding gradients and two ky-phase coding gradients respectively can typically be applied whose phases impressed on the nuclear spins total up to zero. The two kz-phase coding gradients (ky-phase coding gradients) then typically have the same values of amplitude, but with opposite polarity. The second radiated kz-phase coding gradients (ky-phase coding gradients) are also designated as rewinder kz-phase coding gradients (rewinder ky-phase coding gradients). In general, more than two phase coding gradients can also be radiated as a result of a refocusing pulse.

A spatial resolution that is produced by the kz-phase coding gradients and the ky-phase coding gradients can typically be significantly lower along the first direction (slice selection direction) than along the second direction. For example, the number of phase coding steps along the first direction can be in the range of 5-50, preferably 7-20, particularly preferably 11-17, while the number of phase coding steps along the second direction can be in the range from 100 to 1000, for example. For example, a number of phase coding steps along the second direction can directly determine a resolution of the MR images, while a greater number of phase coding steps in the first direction (slice selection direction) can improve a quality of the compensation of the artifacts. Alternatively or additionally, it would also be possible that a spacing between nearest sampling points is greater along the first direction (slice selection direction) than along the second direction.

In a conventional SE-based measurement sequence, a refocusing pulse typically has a flip angle of 180°. This leads to a maximization of the signal-to-noise ratio (SNR) of the MR data, but can typically simultaneously increase the SAR. It can presently be possible that different refocusing pulses have different flip angles. For example, the flip angles of the refocusing pulses can vary in a range from approximately 40° to 180°, particularly preferably in a range from 50° to 150°. In spite of the general variation of the refocusing pulses, without limitation of the generality it can be possible that at least individual refocusing pulses have the same flip angle.

It is possible to dimension the kz-phase coding gradients flexibly. For example, the readout partitions can be arranged equidistantly along the first direction in k-space. Alternatively or additionally, it would also be possible that the readout partitions are arranged symmetrically along a semi-axis of the first direction that is positive or negative relative to a k-space center.

As noted above, the cited step of slice-selective excitation, slice-selective refocusing, and the respective associated steps of the application of the at least one kz-phase coding gradient and of the at least one ky-phase coding gradient, can be repeated in a different order. It is possible to respectively implement the slice-selective excitation intermittently in order to always retain a sufficiently large transversal component of the nuclear spins.

In general, it is possible to repeat the aforementioned steps of the selective excitation, the slice-selective refocusing and the respective associated steps of the application of the at least one kz-phase coding gradient and of the ky-phase coding gradient accordingly for the at least one additional slice, i.e. with slice selection gradient (that is adapted if necessary) along the slice selection direction. For example, it would be possible for the at least one or two of the at least one additional slices to adjoin the target slice. MR data for the at least one additional slice can be acquired.

The SAR caused by a refocusing pulse typically correlates with the corresponding flip angle. Larger (smaller) flip angles can produce a larger (smaller) SAR. According to the present techniques, different flip angles can be implemented such that the SAR decreases overall. It can thereby in turn be possible to reduce down times, and therefore to reduce the measurement time.

In general, different refocusing pulses can have different flip angles. Overall, it can be possible to thereby reduce the SR. This variation of the flip angle can take place randomly (for example) in a simple embodiment, for example in order to obtain a defined SAR overall via a provided scattering or, respectively, distribution. However, it should be noted that a variation of the flip angle has as a consequence a variation of the measured signal amplitudes, from which deviations of the image contrast that may rise to the level of image artifacts may occur, in the form of brightenings, shadowings or even (for example) overlapping of displaced image structures (ghost images). In general, slow signal changes in k-space are less disruptive than sharp signal jumps.

However, it would be possible to vary the flip angles systematically, for example depending on defined parameters. These parameters can generally be properties of the examination subject and/or of the measurement sequence. For example, the flip angle variation can be established depending on the number of metal parts.

For example, a first kz-phase coding gradient can belong to a first refocusing pulse, wherein the first kz-phase coding gradient defines a first readout partition. A second kz-phase coding gradient can belong to a second refocusing pulse, wherein the second kz-phase coding gradient defines a second readout partition. The second readout partition can have a larger spacing along the first direction relative to a k-space center than the first readout partition. The flip angle of the first refocusing pulse can be greater than the flip angle of the second refocusing pulse.

For example, the k-space center can designate that point in k-space that is associated with a k-vector of 0, meaning that wavelength of the nuclear spin excitation goes to infinity. The distance of a readout partition from the k-space center along the first direction can be defined as the shortest distance from the readout partition to a k-vector with a kz-component of 0. For example, it would be possible that two or more readout partitions have the same distance from the k-space center. However, it is also possible that there are no readout partitions with the same distances from the k-space center, meaning that all readout partitions have alternating different distances from the k-space center along the first direction (slice selection direction).

Readout partitions that have a larger (smaller) distance from the k-space center can as such be associated with an refocusing pulse that has a smaller (larger) flip angle. In general, the flip angle of the refocusing pulses of the measurement sequence can be varied in a defined manner, and in fact depending on the position in k-space along the first direction (slice selection direction) as coded by the respective associated SE; for example, it would also be possible that such readout partitions which have a larger (smaller) distance from the k-space center are associated with a respective refocusing pulse that has a larger (smaller) flip angle.

For example, the flip angle of the refocusing pulses can decrease for increasing distances of the associated readout partitions along the first direction relative to a k-space center. The most different embodiments, with regard to a concrete curve of a variation of the flip angle depending on the distance of the associated readout partition along the first direction relative to the k-space center. For example, a strong (weak) decline of the flip angle of the refocusing pulses can be chosen starting from the k-space center towards the periphery of k-space; the SAR can be strongly (weakly) reduced in such a manner, but at the same time a large (small) reduction in the contrast and the resolution can be obtained in those regions of an MR image that, for example, are corrected within the scope of the SEMAC post-processing. It would also accordingly be possible to choose a less steep decline of the flip angle of the refocusing pulses as a function of the distance of the associated readout partitions from the k-space center along the first direction (slice selection direction); in such a case, a reduction of the contrast and of the resolution, as well as potential image disruptions due to strong signal jumps in k-space in the corresponding regions of the MR images that are corrected via the SEMAC post-processing, turn out to be less severe, but at the same time the SAR reduction can also turn out to be less. Therefore, in general a tradeoff can be made between the sought SAR gain and the tolerable reduction of contrast and/or resolution of the MR images.

In the preceding, techniques have been described in which the flip angle of the refocusing pulses that belong to a readout partition with comparably short distance from the k-space center along the first direction is chosen to be greater than for those refocusing pulses that belong to far distant readout partitions. In such a case, a particularly advantageous reduction of resolution and contrast of the achieved MR images can take place. This is the case since—within the scope of the dependencies that are generally applicable to Fourier transformation—regions close to the k-space center have a stronger influence on contrast and sharpness of the MR image than further distant regions. Therefore, a stronger reduction of the flip angle in just these further distant regions of k-space can have a comparably smaller influence on contrast and sharpness of the MR image.

In this regard, an additional particularly advantageous effect can be achieved. In the previously described case, it can be possible that such refocusing pulses that belong to a readout partition with greater distance from the k-space center have a smaller flip angle. Due to the smaller flip angle, in general (as stated in the preceding) the MR image quality of the MR image is reduced. However, since a relatively strong reduction of the flip angle occurs only along (for example) the first direction in which distortions in the excitation profile can be present due to inhomogeneities of the magnetic field, such a negative effect of the reduction of the flip angle is essentially limited to those components of an MR image that should be deskewed anyway by the SEMAC-like correction. In other words, this means that the reduction of the flip angle has a comparably large influence on the contrast reduction in the MR images in those regions in which significant distortion artifacts are inherently present due to the metal artifacts. However, in these regions the image quality is typically predominantly limited by the distortion artifacts, and a further reduction of the image quality of the MR images is not of (or is not of any significant) consequence due to the reduced flip angle. All remaining regions of the MR image can profit from a high flip angle.

In general, a variety of quantitative dependencies can be implemented within the scope of a systematic variation of the flip angle of the refocusing pulses as a function of the distance of the associated readout partition(s) along the first direction from the k-space center.

For example, the flip angle of the refocusing pulses may decrease linearly or superproportionally (i.e. quadratically, for example) for increasing distances of the associated readout partitions along the first direction.

For example, the functional dependency of the flip angle may be symmetrical with regard to the k-space center depending on the corresponding distance of the associated readout partitions from the k-space center along the first direction. For example, those refocusing pulses whose associated readout partitions have the same (different) distances from the k-space center have the same (different) flip angles.

For example, in general a first kz-phase coding gradient can belong to a first refocusing pulse, wherein the first kz-phase coding gradient defines a first readout partition. A second kz-phase coding gradient can belong to a second refocusing pulse, wherein the second kz-phase coding gradient defines a second readout partition. The first readout partition can have a defined distance from a k-space center along the positive semi-axis of the first direction. The second readout partition can also have the defined distance from the k-space center along the negative semi-axis of the first direction. The flip angle of the first refocusing pulse can essentially be identical to the flip angle of the second refocusing pulse.

The effect of a symmetrical functional dependency of the flip angle with regard to the k-space center can therefore be achieved. This can allow a particularly advantageous tradeoff between reduced SAR and reduced image quality of the MR images.

In the preceding, techniques have been explained in which the flip angle of a refocusing pulse is varied depending on a distance of the associated readout partition(s) from the k-space center along the first direction. In other words: the readout partition—in particular its position in k-space or, respectively, the influence of the readout partition on the selection of the flip angle—can thus presently be determined by the kz-phase coding gradient, for example because the readout partition extends over the entire scanned region of k-space along the second direction.

However, it would alternatively or additionally also be possible that the multiple readout partitions of the target slice are also defined by the ky-phase coding gradients. The flip angle of the refocusing pulses can decrease for increasing distances of the associated readout partitions from the k-space center in the plane defined by the first and second direction. For example, the distance of a readout partition can be defined with regard to a middle point of the readout partition. However, it is also be possible for the distance of the readout partition to be defined, for example, the shortest distance between any point of the readout partition from the k-space center. The most varied of such distance measurements can be applied.

It may occur that all refocusing pulses that are associated with a defined readout partition have the same flip angle. In such a case described in the preceding, a variation of the flip angle thus takes place not solely depending on the position along the first direction (slice selection direction) but also depending on the position in the plane defined by the first and second direction. A particularly strong SAR reduction then can be achieved, wherein the influences of the correspondingly reduced flip angle on the reduction of the image quality of the MR images can turn out to be relatively small.

According to a further aspect, the invention concerns an MR system that is designed to operate for slice-selective MR imaging of a target slice of an examination subject. The MR imaging takes into account MR data of multiple readout partitions of the target slice, as well as multiple readout partitions of at least one additional slice. The consideration takes place to reduce image artifacts due to magnetic field inhomogeneities. The at least one additional slice is adjacent to the target slice. The MR system comprises a gradient system and a radio-frequency unit that are configured in order to implement the following steps: slice-selective excitation of nuclear spins via application of at least one slice selection gradient along a first direction, and via time-correlated radiation of at least one excitation pulse; slice-selective refocusing of excited nuclear spins via sequential application of multiple additional slice selection gradients along the first direction, and via time-correlated radiation of multiple refocusing pulses. The gradient system and the radio-frequency unit are also configured in order to implement the following steps for each additional slice selection gradient and associated refocusing pulse: activate at least one kz-phase coding gradient along the first direction, respectively to define a readout partition; and activate at least one ky-phase coding gradient along a second direction to acquire MR data, wherein the first direction and the second direction are oriented orthogonal to one another. The multiple refocusing pulses have at least two different flip angles.

For example, the MR system can be configured in order to implement the method for slice-selective MR imaging according to an additional aspect of the present invention.

For such an MR system, effects can be achieved that are comparable to the effects that can be achieved with the method for slice-selective MR imaging according to the further aspect of the present invention.

The features presented above, and features that are described in the following, can be used not only in the corresponding, explicitly presented combinations, but rather also in additional combination or in isolation.

DESCRIPTION OF THE PREFERRED EMBODIMENTS

In the following, the present invention is explained in detail using preferred embodiments, with reference to drawings. In the figures, identical reference characters designate identical or similar elements. The figures are schematic representations of different embodiments of the invention. Elements shown in the figures are not necessarily shown true to scale. Rather, the different elements shown in the figures are rendered such that their function and general purpose is understandable to those skilled in the art. Connections and couplings between functional units and elements that are shown in the figures can also be implemented as an indirect connection or coupling. A connection or coupling can be implemented hardwired or wireless. Functional units can be implemented as hardware, software or a combination of hardware and software.

Techniques of MR imaging are explained in the following in connection with SEMAC measurement sequences. Within the scope of the conventional SEMAC measurement sequence, no variation of the flip angle of the refocusing pulses takes place along the slice selection direction kz, depending on the coded readout partition; refocusing pulses of a sequence of refocusing pulses that is radiated in order to acquire MR data from different readout partitions along the slice selection direction have no varying flip angle along the slice selection direction kz. Accordingly the presently described techniques, a variation of the flip angles takes place. For example, the flip angles of the refocusing pulses can be varied such that those refocusing pulses whose associated readout partitions have a larger (smaller) distance along the slice selection direction from the k-space center have a smaller (larger) flip angle. Different qualitative and quantitative functional dependencies of the variation of the flip angles on the aforementioned distance from the k-space center are possible, for example linearly or quadratically. In general, the readout partitions themselves can be arranged differently in k-space, for example symmetrically relative to the k-space center and/or equidistantly from one another. For example, the readout partitions can include all sample points with identical position in k-space along the kz-direction. However, it is also possible for a readout partition, within which the respective refocusing pulses have the same flip angle, to include only a portion of all scan points with the same position in k-space along the slice selection direction; the readout partitions is then also defined by the ky-phase coding gradient.

Such aforementioned techniques allow a SAR reduction, for example in comparison with conventional SEMAC measurement sequences. It can in turn thereby be possible to reduce the measurement time since provided down times can be reduced.

Such techniques can be advantageously usable in particular if inhomogeneities of the magnetic field are present, for example due to orthopedic implants in the examination region. The MR imaging of patients with orthopedic implants has developed into an important application over the past few years. The basic problem is that the different magnetic susceptibilities between metallic implants and body tissues disrupts the homogeneity of the magnetic field and thereby can lead to significant negative effects on the diagnostic image quality of the MR images. In addition to the adulteration of the image contrast or, respectively, signal losses, the geometric distortion of the MR image represents a significant problem, wherein here again the distortion of the excited slice profile in slice-selective MR imaging represents a dominant cause of the image artifacts generated in the MR image. The known techniques for reduction of these artifacts are typically associated with a significant increase of the RF power deposited in the examination subject. This can be due to the fact that the SE measurement sequence or turbo SE measurement sequence that is preferred for orthopedic applications is very RF power-intensive anyway. It can be necessary to provide additional downtimes within the measurement sequence. The measurement time can thereby be significantly extended in order to keep the RF power absorbed by the patient or, respectively, the SAR within predetermined limits. In view of the increasingly widespread use of MR systems with high field strengths of the basic magnetic field (for example 3 Tesla or more), the limitation provided by the limited SAR is so great that it is difficult, or even possible only to a limited extent, to implement an effective artifact reduction within a tolerable measurement time, for example given the frequently encountered hip or knee prostheses with cobalt/chromium coatings. This is the case since the cobalt/chromium coatings have ferromagnetic contents, and therefore lead to a particularly large change in the magnetic susceptibility, and consequently to particularly large geometric distortions.

In the following, techniques are explained that improve the applicability of MR imaging with regard to SAR and measurement time, in spite of the presence of metallic implants.

Figure 1:
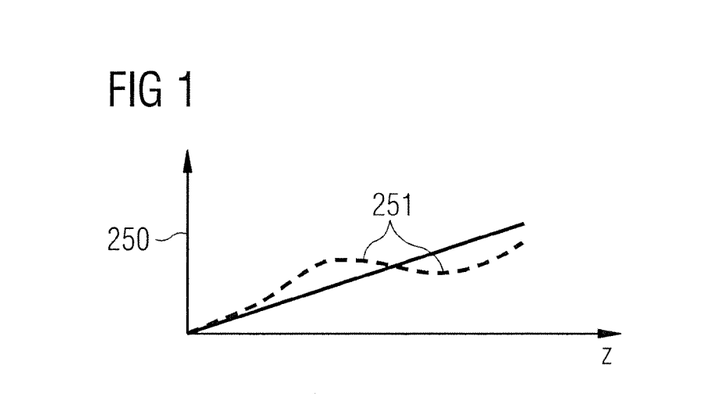
FIG. 1 illustrates magnetic field inhomogeneities as a function of the location along the slice selection direction.

For example, FIG. 1 illustrates an inhomogeneity 251 of the magnetic field 250 in the presence of a slice selection gradient along the slice selection direction (z-direction). The magnetic field can be the locally active magnetic field (B-field). This can deviate from the nominally applied basic magnetic field due to susceptibility artifacts and/or demagnetization effects. The ideally present spatial curve of the magnetic field 250 would be linear (represented by the solid line in FIG. 1). Due to the magnetic field inhomogeneity 251, deviations occur relative to the linear curve (represented by the dashed line in FIG. 1). The deviations can be so strong that there is no longer an unambiguous association between spatial position along the z-direction and resonance frequencies (see FIG. 1). However, smaller deviations can also already be sufficient in order to produce significant artifacts (for example distortions and so forth) in the MR images.

Figure 2:
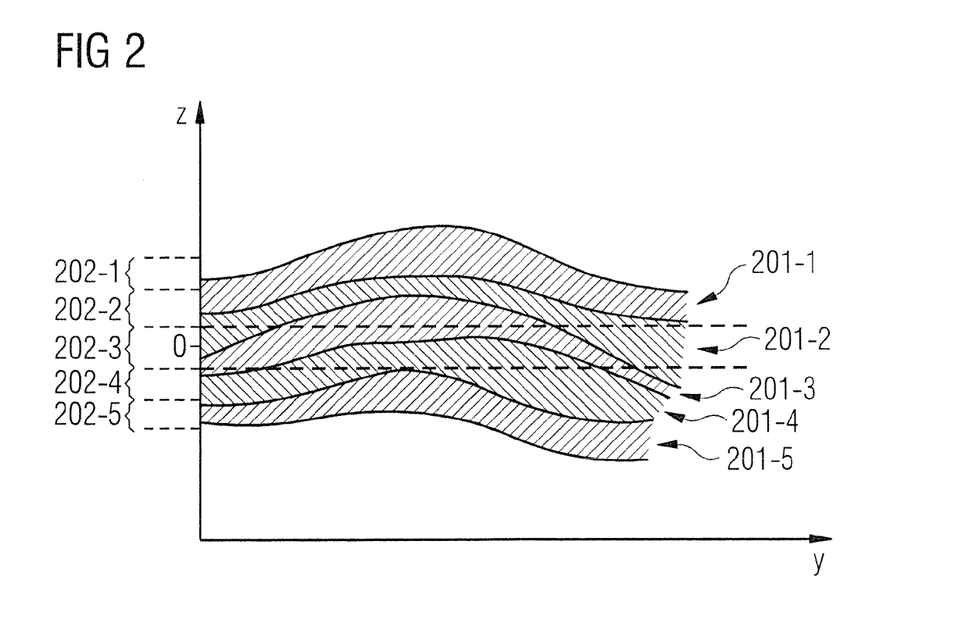
FIG. 2 illustrates excitation profiles in the presence of magnetic field inhomogeneities, as well as slice profiles.

As examples in FIG. 2, excitation profiles 201-1, 201-2, 201-3, 201-4, 201-5 are shown that are obtained as a result of the slice-selective excitation of the nuclear spins by means of slice selection gradients and time-correlated radiated excitation pulse. Due to the magnetic field inhomogeneities 251, these excitation profiles do not have a planar, flat form. However, to reduce the artifacts it is worthwhile to obtain MR data from slices 202-1-202-5 that are optimally planar (shown on the left side in FIG. 2). If the slices for which the MR are acquired are not planar, this typically leads to distortion artifacts. In the following, techniques are shown which allow such artifacts to be reduced.

Figure 3:
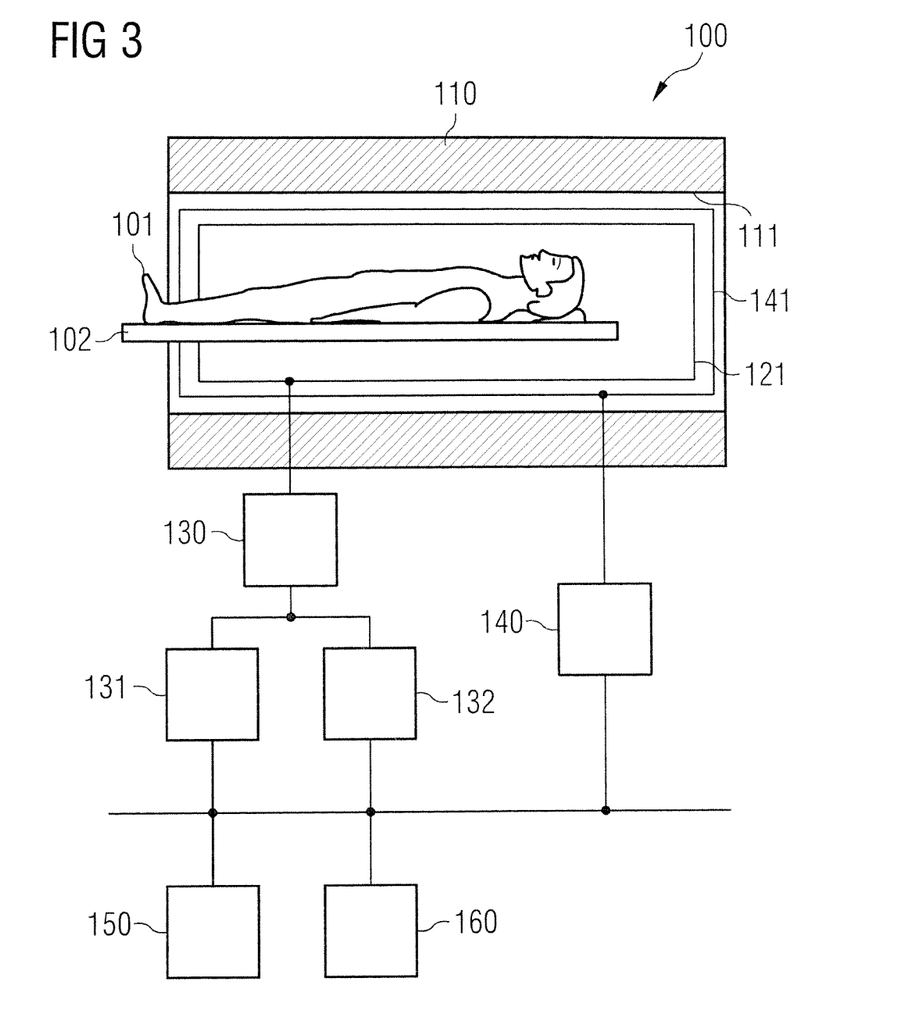
FIG. 3 is a schematic view of an MR system.

For this purpose, an appropriately configured MR system 100 can be used (see FIG. 3). The MR system 100 has a magnet 110 that defines a tube 111. The magnet 110 generates the basic magnetic field parallel to its longitudinal axis. The basic magnetic field can exhibit inhomogeneities, thus local deviations from a desired value. An examination subject (here an examined person 101) can be slid on a recumbent table 102 into the magnet 110. Furthermore, the MR system 100 has a gradient system 140 to generate gradient fields that are used for MR imaging and for spatial coding of acquired raw data. The gradient system 140 typically comprises at least three gradient coils 141 that are separately controllable and positioned in a well-defined manner relative to one another. The gradient coils 141 enable gradient fields to be applied and switched along defined spatial directions (gradient axes). For example, the gradient fields can be used for slice selection along the slice selection direction, for frequency coding (in the readout direction) and for phase coding. The phase coding can take place along the slice selection direction and along a second direction orthogonal to this. A spatial coding of the raw data can thereby be achieved. The spatial directions that are respectively situated parallel to the slice selection gradient fields, phase coding gradient fields and readout gradient fields do not necessarily need to be coincident with the machine coordinate system.

For example, the examined person 101 can have orthopedic implants. This leads to a local inhomogeneity of the magnetic field. To excite the polarization or, respectively, alignment of the nuclear spins or magnetization in the longitudinal direction that result in the basic magnetic field, an RF coil arrangement 121 is provided that can radiate an amplitude-modulated RF excitation pulse into the examined person 101. The resonance frequency of the nuclear spins varies depending on the local magnetic field. The RF excitation pulses must accordingly be matched to the local resonance frequency of the nuclear spins. A transverse magnetization can thereby be generated. To generate such RF excitation pulses, an RF transmission unit 131 is connected by an RF switch 130 with the RF coil arrangement 121. The RF transmission unit 131 can include an RF generator and an RF amplitude modulation unit. The RF excitation pulses can flip the transverse magnetization out of the steady state slice-selectively in 1d or spatially selectively or globally in 2D, 3D. In particular, techniques are explained herein in which a slice-selective excitation occurs.

Furthermore, an RF reception unit 132 is coupled via the RF switch 130 with the RF coil arrangement 121. Via the RF reception unit 132, MR signals of the relaxing transversal magnetization can be acquired as MR data, for example via inductive injection into the RF coil arrangement 121.

In general, it is possible to use separate RF coil arrangements 121 for the radiation of the RF excitation pulses by means of the RF transmission unit 131, and for the acquisition of the MR data by means of the RF reception unit 132. For example, a volume coil 121 can be used for the radiation of RF pulses, and a surface coil (not drawn) which comprises an array of RF coils can be used for the acquisition of raw data. For example, the surface coil for the acquisition of raw data can be comprised of 32 individual RF coils, and therefore can be particularly suitable for partially parallel imaging (ppa imaging, partially parallel acquisition). Appropriate techniques are known to those skilled in the art, and thus no additional details need to be explained herein.

Furthermore, the MR system 100 has an operating unit 150 which, for example, can comprise a monitor, a keyboard, a mouse etc. User entries can be detected and an output to the user can be realized by the operating unit 150. For example, the operating unit 150 can allow individual operating modes or operating parameters of the MR system to be set by the user and/or automatically and/or by remote control.

Furthermore, the MR system 100 has a computer 160. For example, the computer 160 can be set up to implement diverse computation operations within the scope of post-processing via SEMAC techniques.

Figure 4:
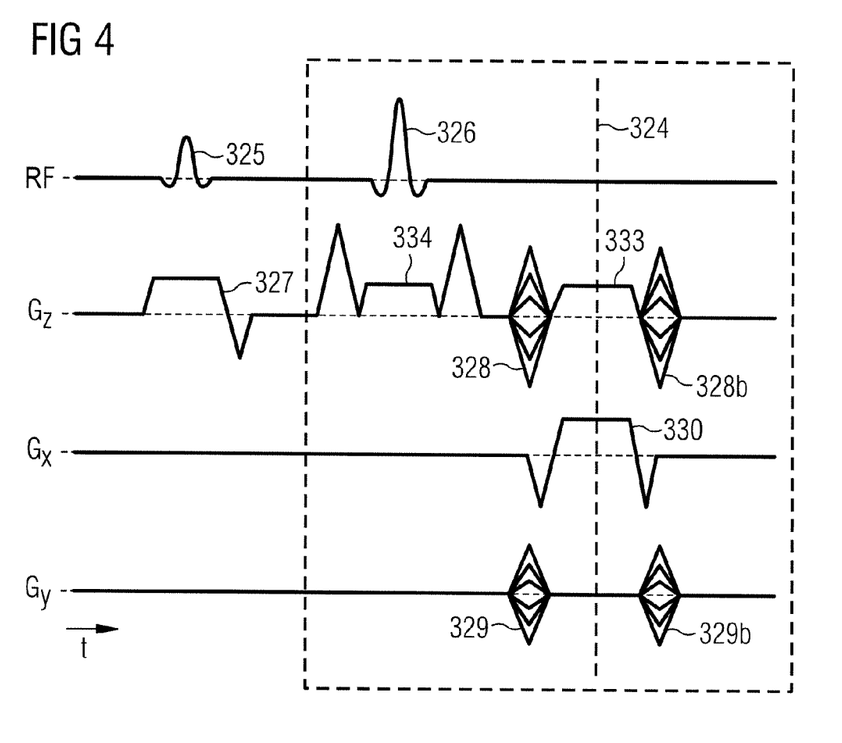
FIG. 4 shows an SE measurement sequence.

Furthermore, the MR system 100 is configured in order to acquire MR data by execution of a measurement sequence as shown in FIG. 4. FIG. 4 shows an SE measurement sequence as it is used in connection with SEMAC techniques. For example, MR data from the slice 202-3 (see FIG. 2)—in the following the target slice—are acquired by means of this SE measurement sequence. The measurement sequence can be repeated for the additional slices 202-1, 202-2, 202-4, 202-5 (see FIG. 2).

The nuclear spins are excited by an excitation pulse 325 while a slice selection gradient 327 is switched (activated) in the slice selection direction kz, so that a slice-selective excitation takes place. A refocusing pulse 326 is subsequently switched with a defined angle while an additional slice selection gradient 334 is switched in the slice selection direction kz. A phase coding subsequently takes place with the kz-phase coding gradient 328 and the ky-phase coding gradient 329 along the second direction ky (i.e. orthogonal to the slice selection direction) before a k-space line along a third direction kx is read out given a switched readout gradient 330. The third direction kx is orthogonal to the second direction ky and the first direction (slice selection direction kz). The optional gradient 333 switched during the readout serves for what is known as view angle tilting compensation as it is described in the aforementioned publication by W. Lu et al. SE 324 occurs in the middle of the readout. The SEs correspond to individual sample points of k-space.

If additional refocusing pulses 326 follow after the first refocusing pulse 326 (illustrated by the dashed region in FIG. 4), such a measurement sequence is typically designated as a turbo spin echo (TSE), or synonymously as a fast spin echo (FSE). In particular in such a case, what are known as rewinder phase coding gradients 328b, 329b can be switched along the slice selection direction kz and the second direction ky following the SE 324 or before the repeat radiation of a refocusing pulse 326. For example, the rewinder phase coding gradients 328b, 329b can enable the phases of the nuclear spins to rotate back before an additional refocusing pulse 326 is switched. The accumulated moment of the kz-phase coding gradient (ky-phase coding gradient) and of the kz-rewinder phase coding gradient (ky-rewinder phase coding gradient) typically amounts to zero.

Figure 5:
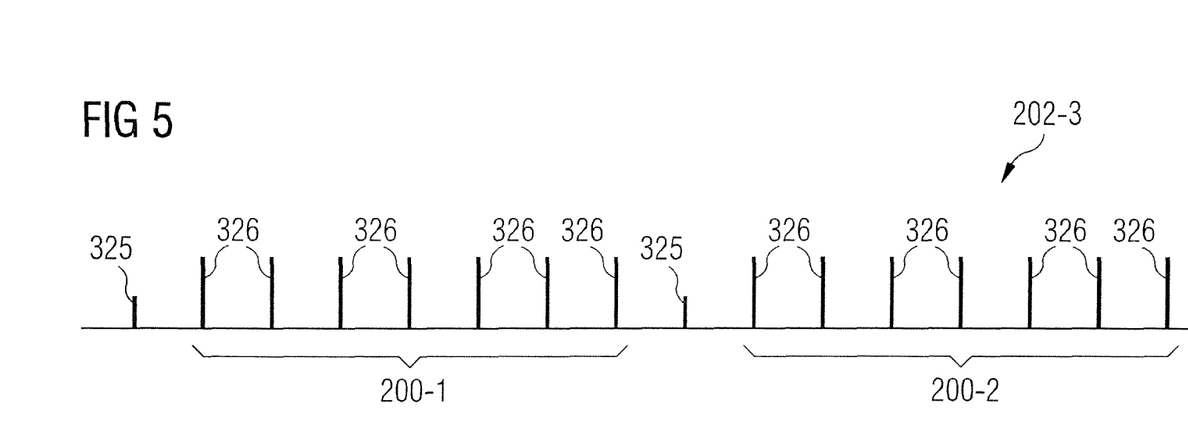
FIG. 5 shows a sequence of refocusing pulses of a turbo spin echo (TSE) measurement sequence in connection with the measurement sequence of FIG. 4.

A defined sample point in k-space can be scanned (MR data for this sample point can be acquired) by the application of a kz-phase coding gradient 328 and a ky-phase coding gradient 329. For example, one or more refocusing pulses 326 can be switched per excitation pulse 325, and therefore additional different sample points can respectively be measured (filled). The dashed, emphasized portions of the measurement sequence—respectively with adapted kz-phase coding gradient 328 and ky-phase coding gradient 329—can be repeated accordingly. This is depicted in FIG. 5. FIG. 5 illustrates the case that a respective kz-phase coding gradient 328 and a respective ky-phase coding gradient 329 are switched per refocusing pulse 326; the kz-phase coding gradients hereby all have consistent amplitudes, and the ky-phase coding gradients 329 have different amplitudes. The refocusing pulses that follow an excitation pulse 325 are therefore associated with the same readout partitions 200-1, 200-2. It would also be possible that more than one readout partition 200-1-200-7 is coded after an excitation pulse 325. It is also possible for a defined readout partition 200-1-200-7 to be coded following more than one excitation pulse 325. In other words: the excitation can be implemented intermittently via radiation of the excitation pulse 325.

The situation shown in FIG. 5, in which multiple refocusing pulses 326 are used after an excitation pulse 325, is also designated as an echo train, pulse train or, respectively, sequence of refocusing pulses 326. In typical slice-selective imaging without the SEMAC method, a pulse train of refocusing pulses 326 codes different sample points along the ky-direction in k-space. In the SEMAC method, these pulse trains of refocusing pulses 326 are repeated multiple times, wherein each pulse train additionally defines a kz-phase coding gradient 328 so that each pulse train acquires at least portions of a readout partition 200-1-200-7.

The excitation pulse 325 excites slice-selectively. Such a 2D phase coding, in connection with SEMAC techniques as described above, can be compared only to a limited extent with conventional 3D measurement sequences. Within the scope of 3D imaging, techniques with variable flip angle are customary in which the flip angle of an echo train is likewise modulated along the 3D directions in order to reduce SAR. Such techniques are known to the person skilled in the art, for example within the scope of the Sampling Perfection with Application optimized Contrasts using different flip angle Evolutions (SPACE) technique; see in this regard J. P. Mugler 3rd et al., Practical implementation of optimized tissue-specific prescribed signal evolutions for improved turbospin-echo imaging, Proc. 11$^{th}$ Annual Meeting of ISMRM (2003) 203. A decisive difference relative to SEMAC measurement sequences is that in conventional 3D MR imaging an entire examination volume is excited that is spatially coded by the phase coding. It is different in SEMAC measurement sequences: here excitation takes place slice-selectively, meaning that only a thin slice is excited, as is also the case in conventional 2D imaging. The additional phase coding in the slice selection direction thereby includes no information about image regions outside of the excited slice, but rather serves only to determine distortions of the slice excitation that are caused by the susceptibility jumps. For this reason, the variation of the flip angle of the refocusing pulses along the slice selection direction that is described here has a different effect on properties of the MR image, and therefore inherently also has different criteria with regard to suitable defining factors of the variation. For example, the dependencies and defining factors for variation of the flip angle within the scope of 3D imaging are typically designed such that, in spite of longer echo trains, a desired contrast is achieved given optimally low incidence of what is known as T2 blurring for specific tissue types. In contrast: given techniques according to the invention, the variation of the flip angle of the refocusing pulses is aimed at a SAR reduction given simultaneous optimally small effect on the artifact correction and the contrast of the MR images. A basic goal is to limit effects of the variation of the flip angle of the refocusing pulses on those regions of the MR images that are affected by quality losses anyway due to strong distortions due to susceptibility jumps.

A variation of the flip angle in the direction of the conventional 2D phase coding direction, i.e. the second direction for coding within the slice plane as it has been described for example for SAR reduction for hyper-echo or TRAPS methods (see in this regard J. Henning and K. Scheffler, Hyperechos, Magn. Reson. Med. 46 (2001) 6-12), is analogous to the approach described above given 3D measurement sequences, but reduced to the 2D phase coding direction. These methods are usable independently of the presently described variation of the flip angle of the refocusing pulses along the slice selection direction and, for example, can be used advantageously in combination with the techniques described herein.

Figure 6:
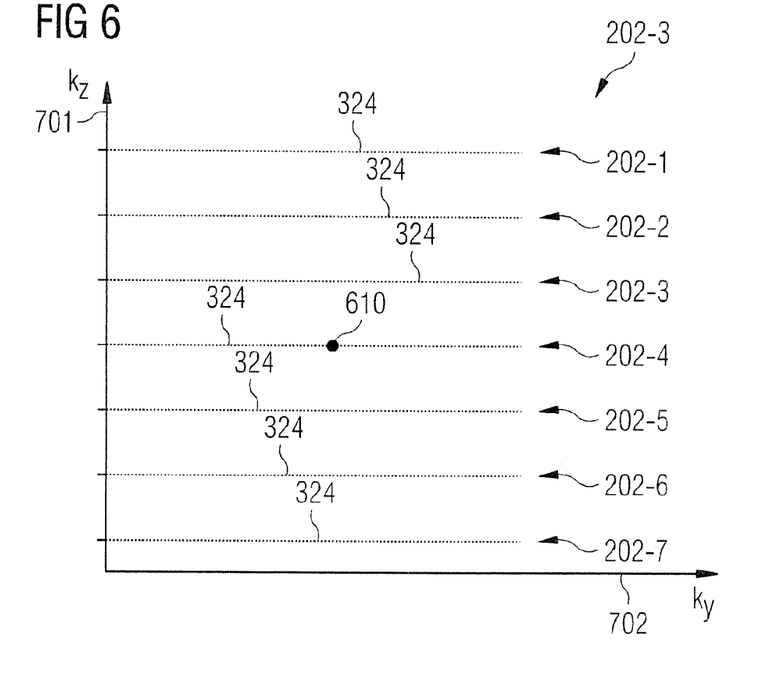
FIG. 6 shows readout partitions and scan points in k-space for the measurement sequence of FIG. 4.

Such a scanning of k-space after slice-selective excitation with regard to the target slice 202-3 is depicted in FIG. 6. K-space is scanned within the scope of seven readout partitions 200-1-200-7 that are arranged along the slice selection direction kz 701, equidistantly and symmetrically relative to the k-space center 610. For each readout partition 200-1-200-7, a large number of phase coding steps (256, for example) is implemented along the second direction ky 702. In FIG. 6, the individual sample points are indicated that respectively correspond to an SE 324. Each of the readout partitions 200-1-200-7 includes all sample points with the same positions along the slice selection direction kz 701.

Figure 7:
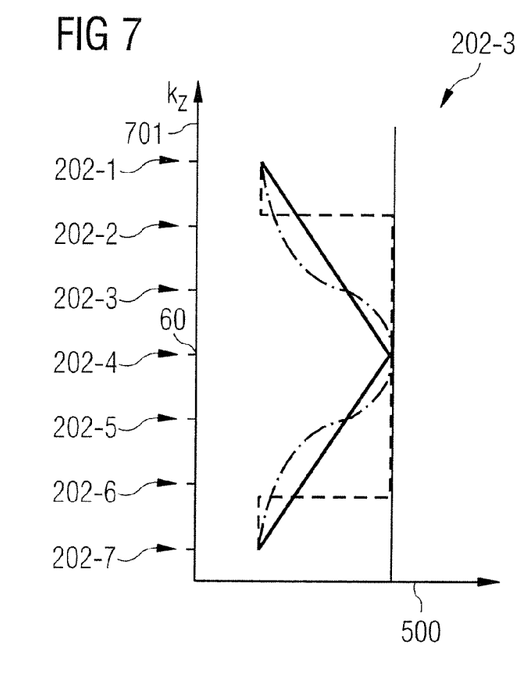
FIG. 7 shows flip angles of refocusing pulses of the measurement sequence of FIG. 5 depending on a distance of associated readout partitions from the k-space center along the slice selection direction.

According to the conventional SEMAC technique, the refocusing pulses 326 all have an identical flip angle 500 as a function of the position along the slice selection direction kz 701 (see FIG. 7, long dashed line). According to the present technique, the refocusing pulses 326 have at least two different flip angles 500 (represented as a solid line, dotted line and dash-dot line in FIG. 7) as a function of the position along the slice selection direction kz 701. From FIG. 7 it can be seen that the flip angle 500 of the refocusing pulses 326 decreases for increasing distances of the associated readout partitions 200-1-200-7 from the k-space center along the slice selection direction kz 701, for example in steps (shown dotted in FIG. 7), linearly (shown solid in FIG. 7) or superproportionally (shown dash-dot in FIG. 7); in FIG. 7, the flip angles 500 could in these cases vary between 50° and 160°, for example. Other quantitative and/or qualitative dependencies are possible. For example, the flip angle 500 could increase for increasing distances from the k-space center 610. A discontinuous and/or random curve of the flip angle 500 would also be possible.

For example, a first kz-phase coding gradient 227 could define the readout partition 200-2 and a second kz-phase coding gradient 328 could define the readout partition 200-1. The readout partition 200-1 has a greater distance along the slice selection direction kz 701 from the k-space center 610 than the readout partition 200-2. The flip angle 500 of the refocusing pulse 326 (which belongs to the readout partition 200-2) is greater than the flip angle 500 of that refocusing pulse 326 that belongs to the readout partition 200-1.

A first kz-phase coding gradient 328 could accordingly define the readout partition 200-2, and a second kz-phase coding gradient 328 could define the readout partition 200-6. The readout partition 200-2 has a defined distance from the k-space center 610 along the positive semi-axis of the slice selection direction kz 701. The readout partition 200-6 also has a defined distance from the k-space center 610 along the negative semi-axis of the slice selection direction kz 701. As can be seen from FIG. 7, the flip angle 500 of the refocusing pulse 326 which belongs to the readout partition 200-2 is essentially identical to the flip angle 500 of the refocusing pulse 326 which belongs to the readout partition 200-6.

In the preceding, a defined implementation of the measurement sequence is shown. Naturally, other implementations can also be chosen. For example, a measurement sequence with 12 phase coding steps along the slice selection direction kz 701 could be particularly advantageous, with a linear reduction of the flip angle of the respective refocusing pulses 326 from 150° at the k-space center 610 to 60° for that refocusing pulse 326 that belongs to the readout partition 200-1-200-7 that has the greatest distance from the k-space center 610 along the slice selection direction kz 701. For example, this means a readout partition in the center 150°, adjoining readout partitions ±1: 135°, next readout partitions ±2: 120°, . . . , outermost readout partitions ±6: 60°. In this example, the readout partitions 200-1-200-7 are symmetrically arranged around the k-space center 610.

Given a phantom measurement at a 3 Tesla system of the Magnetom Skyra type, a SAR reduction was therefore achieved to 59% of the original SAR value given a conventional SEMAC sequence. The artifact reduction is equivalent; the SNR of the MR image with reduced flip angle is not significantly lower. Due to the SAR reduction, in this example the measurement time could be reduced from 10 minutes 37 seconds to 5 minutes 48 seconds, since in particular down times to limit the SAR value could be omitted.

Figure 8:
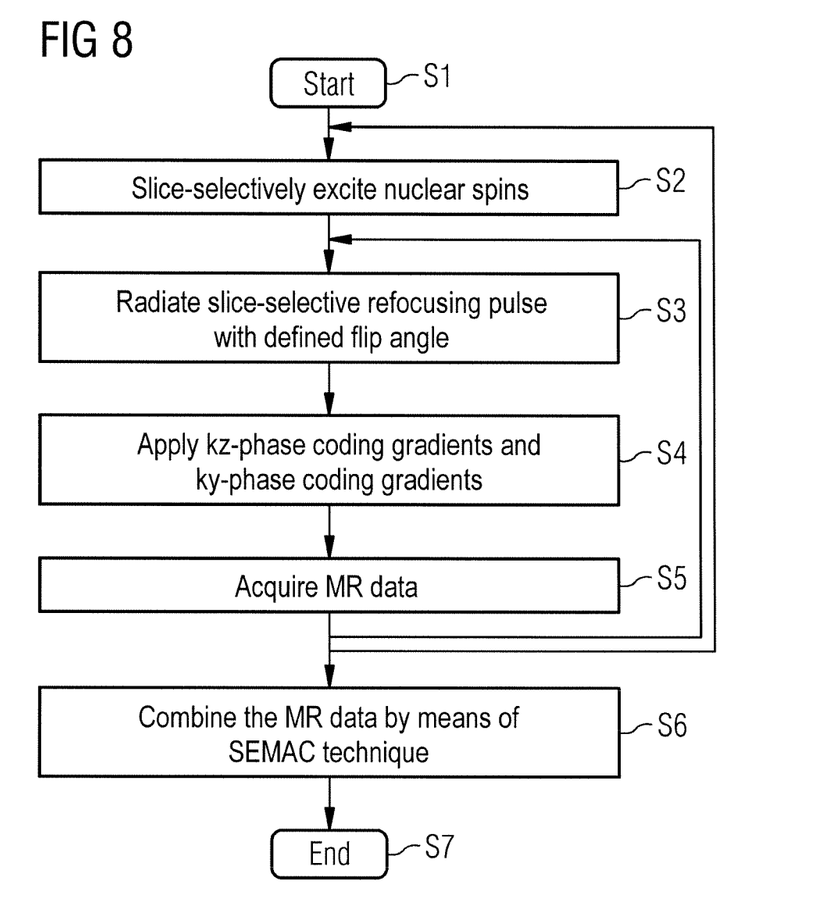
FIG. 8 is a flowchart of an embodiment of the method according to the invention.

A flowchart of a method according to the invention for slice-selective MR imaging is shown in FIG. 8. The method begins in step S1. In step S2, the slice-selective excitation of nuclear spins is initially implemented, for example in that the slice selection gradient 327 along the slice selection direction 701 is applied simultaneously with the excitation pulse 325.

The radiation of a slice-selective refocusing pulse 326 then takes place with a defined flip angle 500 in step S3. For example, the flip angle can also amount to less than 180°, for example between 60° and 150°. For example, the flip angle 500 in step S3 can depend on the gradient subsequently applied in step S4, in particular on the k-space position that is coded via this gradient (see FIG. 7). In step S4, a kz-phase coding gradient 328 and a ky-phase coding gradient 329 are applied for spatial coding. In step S5, the acquisition of MR data then takes place at one or more defined sample points, respectively at a point in time at which the SE 324 is formed as a result of the radiated refocusing pulse from step S3.

Within the scope of a pulse sequence, a rewinder kz-phase coding gradient 328b and a rewinder ky-phase coding gradient 329b (which, for example, can correspond to the kz-phase coding gradient 328 and ky-[character generator 329 with inverted gradient polarity; see FIG. 4) are applied to rotate the signal phase back and to prepare for an additional signal refocusing. Furthermore, the steps S1-S5 are then repeated for the target slice 202-3 (see FIG. 5). In the event that the new slice-selective excitation is required for the target slice 202-3, the steps S2-S5 can also be repeated accordingly.

The steps S2-S5 are also repeated accordingly for additional slices 202-1, 202-2, 202-4, 202-5. In step S6, the MR data are subsequently combined to reduce image artifacts, for example within the scope of a SEMAC post-processing technique. The method ends in step S7.

A significant SAR reduction can thus be achieved by means of the techniques described in the preceding, which SAR reduction would involve either a decisive lengthening of the measurement time or significantly degrade the image quality in conventionally known techniques. In particular, according to different reference implementations a degradation of the image quality can predominantly occur uniformly in all regions of the MR images. Therefore, a significant effect of the method described in the preceding is that a SAR reduction is enabled that does not (or does not significantly) negatively affect a majority of an MR image; in other words, a significant limitation of the quality of the MR image due to the reduced flip angle 500 can be limited to specific regions or, respectively, properties of the MR image. A loss of contrast and/or image sharpness of the MR images is limited to the SEMAC dimension (i.e. the phase coding in the slice selection direction) and thus acts predominantly on those image regions that are affected anyway by comparably strong distortions and immediate proximity of a susceptibility jump (due to an implant, for example). Important practical aspects in this context are on the one hand that the SEMAC correction is normally limited to a small image region. A second important aspect is that, although the SEMAC correction for the most part succeeds in reestablishing the rough image geometry, significant residual artifacts often remain in these regions. If the contrast and/or sharpness of the MR image in these image regions is now slightly reduced the techniques according to the invention, this is subordinate because in these regions of the MR image, the decisive limitation of the MR image quality is dominated by the susceptibility variation.

Furthermore, these techniques can be combined with other already known techniques for SAR reduction. For example, an automated or partially automated solution is possible in which the degree of the SAR reduction is set automatically as soon as the patient-dependent SAR value is known to the measurement system after the start of the examination. For example, the highest possible flip angle (i.e. the best possible image quality) can therefore be respectively selected depending on the patient or, respectively, measurement parameter.

Naturally, the features of the embodiments and aspects of the invention that are described in the preceding can be combined with one another. In particular, the features can be used not only in the described combinations but also in other combinations or independently, without departing from the scope of the invention.

In the preceding, predominantly those techniques have been described in which the flip angle 500 is varied along the slice selection direction kz 701. However, it should be understood that it is in general alternatively or additionally possible to vary the flip angle 500 depending on the position of the associated readout partition 200-1-200-7 along the second direction ky 702. For example, in general those refocusing pules 326 that belong to a readout partition 200-1-200-7 that have a greater (smaller) spacing within the plane that is defined by the first and second direction 701, 702 have a smaller (greater) flip angle 500. Other qualitative or quantitative dependencies are possible.

The preceding techniques can also be directly combined with PPA techniques.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for slice-selective magnetic resonance (MR) imaging of a target slice of an examination subject, comprising:

operating an MR apparatus, in which an examination subject is situated, according to an MR data acquisition protocol to acquire MR data from a target slice of the examination subject and from at least one additional slice of the examination subject, that is adjacent to said target slice, and during the acquisition of said MR data from said target slice and said at least one additional slice, generating a basic magnetic field in said MR apparatus that exhibits basic magnetic field inhomogeneities;

in said MR data acquisition protocol, activating at least one slice-selection gradient along a first spatial direction with time-correlated radiation of at least one excitation pulse, and thereby slice-selectively exciting nuclear spins in the examination subject;

in said MR data acquisition protocol, slice-selectively refocusing the excited nuclear spins by sequentially activating a plurality of additional slice selection gradients along said first direction with time-correlated radiation of a plurality of refocusing pulses with at least two different flip angles;

in said MR data acquisition protocol, for each additional slice selection gradient that is time-correlated with a respective refocusing pulse, activating at least one first phase coding gradient along said first spatial direction that defines a readout partition, and activating at least one second phase coding gradient along a second spatial direction to acquire said MR data, said first direction and said spatial second directions being orthogonal to each other;

entering said MR data acquired from said target slice and said at least one additional slice into a memory organized as k-space in which said first spatial direction defines a first direction in k-space, with said MR data from each of said target slice and said at least one additional slice being entered into k-space in respective, multiple readout partition in k-space that are individually defined along said first direction in k-space by said at least one first phase coding gradient; and from a computer, accessing said memory and, in said computer, executing an image reconstruction algorithm that uses the MR data from the target slice and the MR data from said at least one additional slice in said readout partitions in k-space to reconstruct an image of said target slice that has, due to said MR data being entered into k-space in said multiple readout partition, a reduced level of image artifacts therein that occur because of said basic magnetic field inhomogeneities, and making said image available in electronic form as a data file at an output of said computer.

2. A method as claimed in claim 1 comprising, in said MR data acquisition protocol:
activating multiple first phase coding gradients;
correlating a first of said first phase coding gradients with a first of said refocusing pulses, said first of said first phase coding gradients defining a first of said readout partitions;
correlating a second of said first phase coding gradients with a second of said refocusing pulses, said second of said first phase coding gradients defining a second of said readout partitions;
said second of said readout partitions having a greater distance from a center of k-space along said first direction in k-space than said first of said readout partitions; and
wherein said flip angle of said first of said refocusing pulses is larger than the flip angle of said second of said refocusing pulses.

3. A method as claimed in claim 1 comprising, in said MR data acquisition protocol, radiating said plurality of refocusing pulses with respective flip angles that decrease as respective distances of the associated readout partitions increase along said first direction in k-space relative to a center of k-space.

4. A method as claimed in claim 3 comprising, in said MR data acquisition protocol, radiating said refocusing pulses with respective flip angles that decrease linearly or super-proportionally with increasing distances of the respective associated readout partitions along said first direction relative to a center of k-space.

5. A method as claimed in claim 1 comprising, in said MR data acquisition protocol, arranging said readout partitions equidistantly relative to each other along said first direction in k-space.

6. A method as claimed in claim 1 comprising, in said MR data acquisition protocol, arranging said readout partitions symmetrically along a positive, relative to a center of k-space, semi-axis of said first direction in k-space and along a negative, relative to said k-space center, semi-axis of said first direction in k-space.

7. A method as claimed in claim 1 comprising, in said MR data acquisition protocol:
activating multiple first phase coding gradients;
correlating a first of said first phase coding gradients with a first of said refocusing pulses, said first of said phase coding gradient defining a first of said readout partitions;
correlating a second of said first phase coding gradients with a second of said refocusing pulses, said second of said first phase coding gradients defining a second of said readout partitions;
said first of said readout partitions having a predetermined distance from a center of k-space along a positive, relative to said center of k-space, semi-axis of said first direction in k-space;
said second of said readout partitions also having said predetermined distance from said center of k-space along a negative, relative to said center of k-space, semi-axis of said first direction in k-space; and
said flip angle of said first of said refocusing pulses being substantially equal to the flip angle of the second of said refocusing pulses.

8. A method as claimed in claim 1 comprising, in said MR data acquisition protocol:
also defining said plurality of readout partitions of the target slice by said second phase coding gradient in said second spatial direction, said second spatial direction defining a second direction in k-space; and
radiating said refocusing pulses with respective flip angles that decrease as respective distances of the associated readout partitions from a center of k-space increase, in a plane defined by said first and second directions in k-space.

9. A method as claimed in claim 1 comprising, in said computer, executing a Slice Encoding for Metal Artifact Correction (SEMAC) reconstruction algorithm, as said image reconstruction algorithm.

10. A method as claimed in claim 1 wherein said target slice and said at least one additional slice are substantially planar, and wherein the slice-selective excitation of said nuclear spins occurs in a non-planar manner due to said basic magnetic field inhomogeneities.

11. A magnetic resonance (MR) apparatus for slice-selective magnetic resonance imaging of a target slice of an examination subject, comprising:
an MR apparatus, in which an examination subject is situated, configured to operate according to an MR data acquisition protocol to acquire MR data from a target slice of the examination subject and from at least one additional slice of the examination subject, that is adjacent to said target slice, and during the acquisition of said MR data from said target slice and said at least one additional slice, to generate a basic magnetic field in said MR apparatus that exhibits basic magnetic field inhomogeneities, and said MR apparatus comprising a gradient system and a radio-frequency (RF) antenna arrangement;
said MR apparatus being configured by said MR data acquisition protocol to activate at least one slice-selection gradient from said gradient system along a first spatial direction with time-correlated radiation of at least one excitation pulse from said RF antenna arrangement, and thereby slice-selectively exciting nuclear spins in the examination subject;
said MR apparatus being configured by said MR data acquisition protocol, to slice-selectively refocus the excited nuclear spins by sequentially activating a plurality of additional slice selection gradients from said gradient system along said first direction with time-correlated radiation of a plurality of refocusing pulses with at least two different flip angles from said RF antenna arrangement;

said MR apparatus being configured by said MR data acquisition protocol to activate, for each additional slice selection gradient that is time-correlated with a respective refocusing pulse, least one first phase coding gradient along said first spatial direction that defines a readout partition, and activating at least one second phase coding gradient along a second spatial direction to acquire said MR data, said first direction and said spatial second directions being orthogonal to each other;

a memory organized as k-space in which said first spatial direction defines a first direction in k-space;

said MR apparatus being configured to enter said MR data acquired from said target slice and said at least one additional slice into said memory, with said MR data from each of said target slice and said at least one additional slice being entered into k-space in respective, multiple readout partition in k-space that are individually defined along said first direction in k-space by said at least one first phase coding gradient; and a computer configured to access said memory and execute an image reconstruction algorithm that uses the MR data from the target slice and the MR data from said at least one additional slice in said readout partitions in k-space to reconstruct an image of said target slice that has, due to said MR data being entered into k-space in said multiple readout partition, a reduced level of image artifacts therein that occur because of said basic magnetic field inhomogeneities, and to make said image available in electronic form as a data file at an output of said computer.

* * * * *